United States Patent [19]

Lee

[11] 4,203,142
[45] May 13, 1980

[54] GROUND FAULT SYSTEM AND METHOD OF DETECTION

[76] Inventor: Donald E. Lee, 2033 Parkview Ave., Abington, Pa. 19001

[21] Appl. No.: 929,712

[22] Filed: Jul. 31, 1978

[51] Int. Cl.$^2$ ............................................. H02H 3/32
[52] U.S. Cl. ...................................... 361/42; 324/52; 328/132; 361/87
[58] Field of Search ........................... 361/42, 47–50, 361/68, 69, 78, 87, 110, 111; 328/132; 324/52

[56] References Cited
U.S. PATENT DOCUMENTS 3,970,901  7/1976  Rohr ...................................... 361/87
3,978,374  8/1976  Rohr ...................................... 361/87 X Primary Examiner—Harry E. Moose, Jr.
Attorney, Agent, or Firm—Maleson, Rosenberg & Bilker

[57] ABSTRACT

Disclosed is a ground fault detection system utilizing a distributed array of current rate of rise sensors located at and coupled to the various power substations of an underground trolley system. Threshold detectors and logic circuits measure and compare the rate of rise of current at the various substations with preselected threshold values to distinguish ground faults from normal load transients due primarily to locomotive start-up.

13 Claims, 9 Drawing Figures

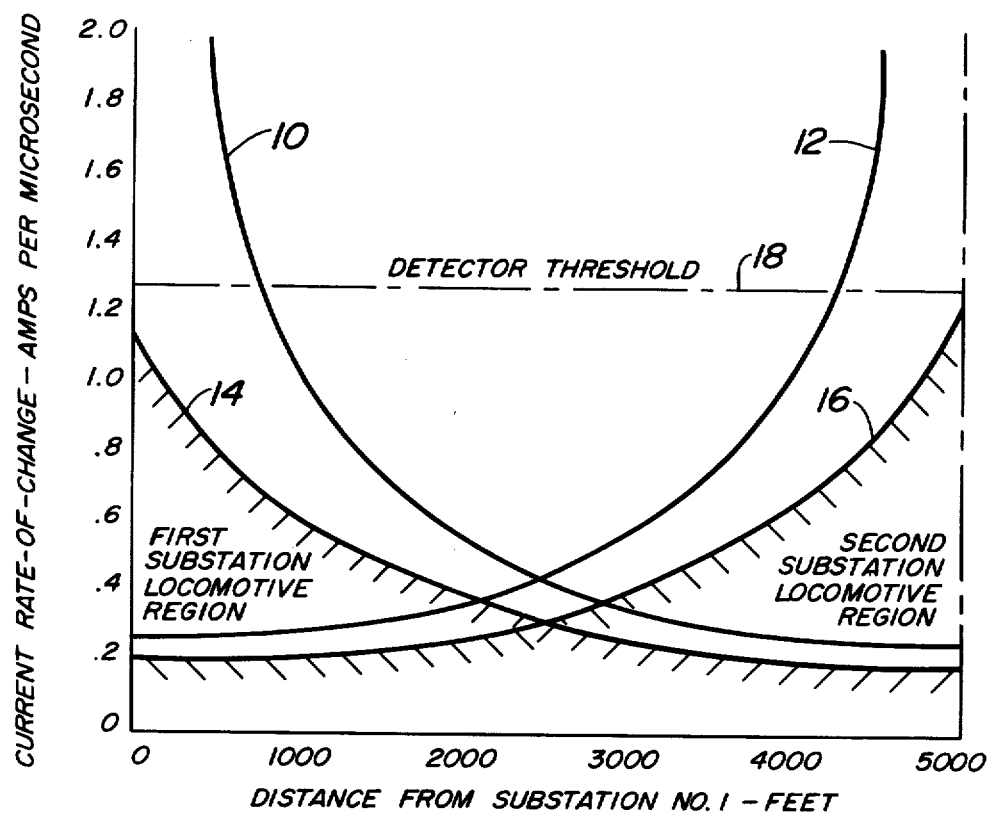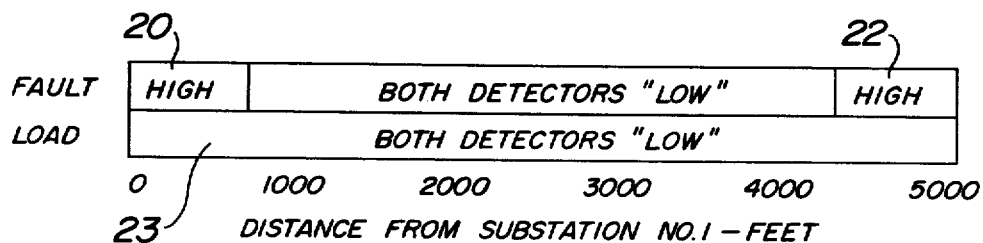
FIG. 1

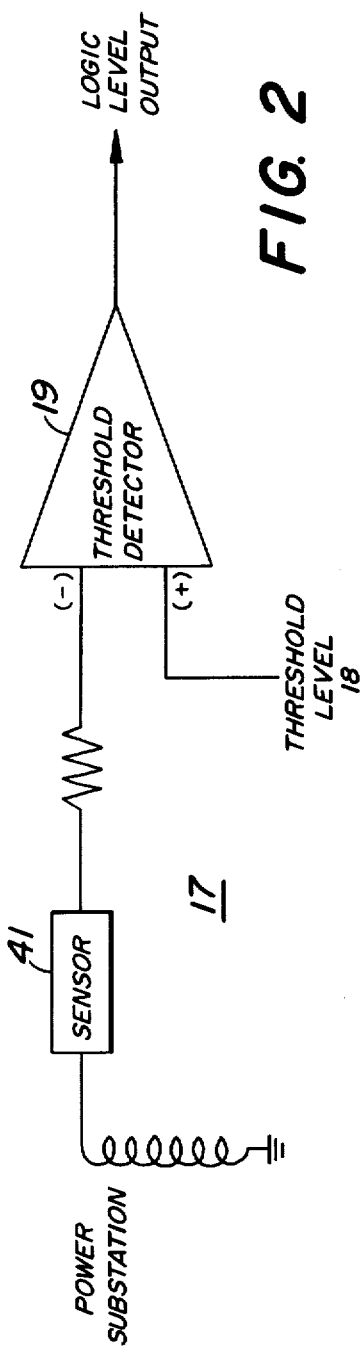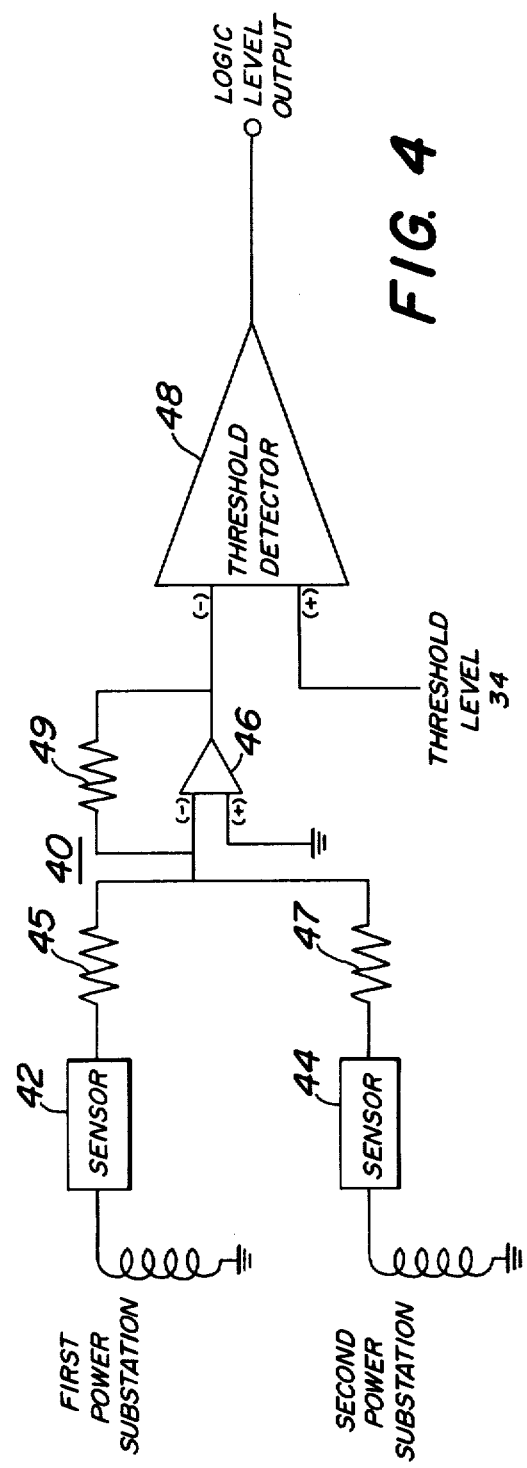

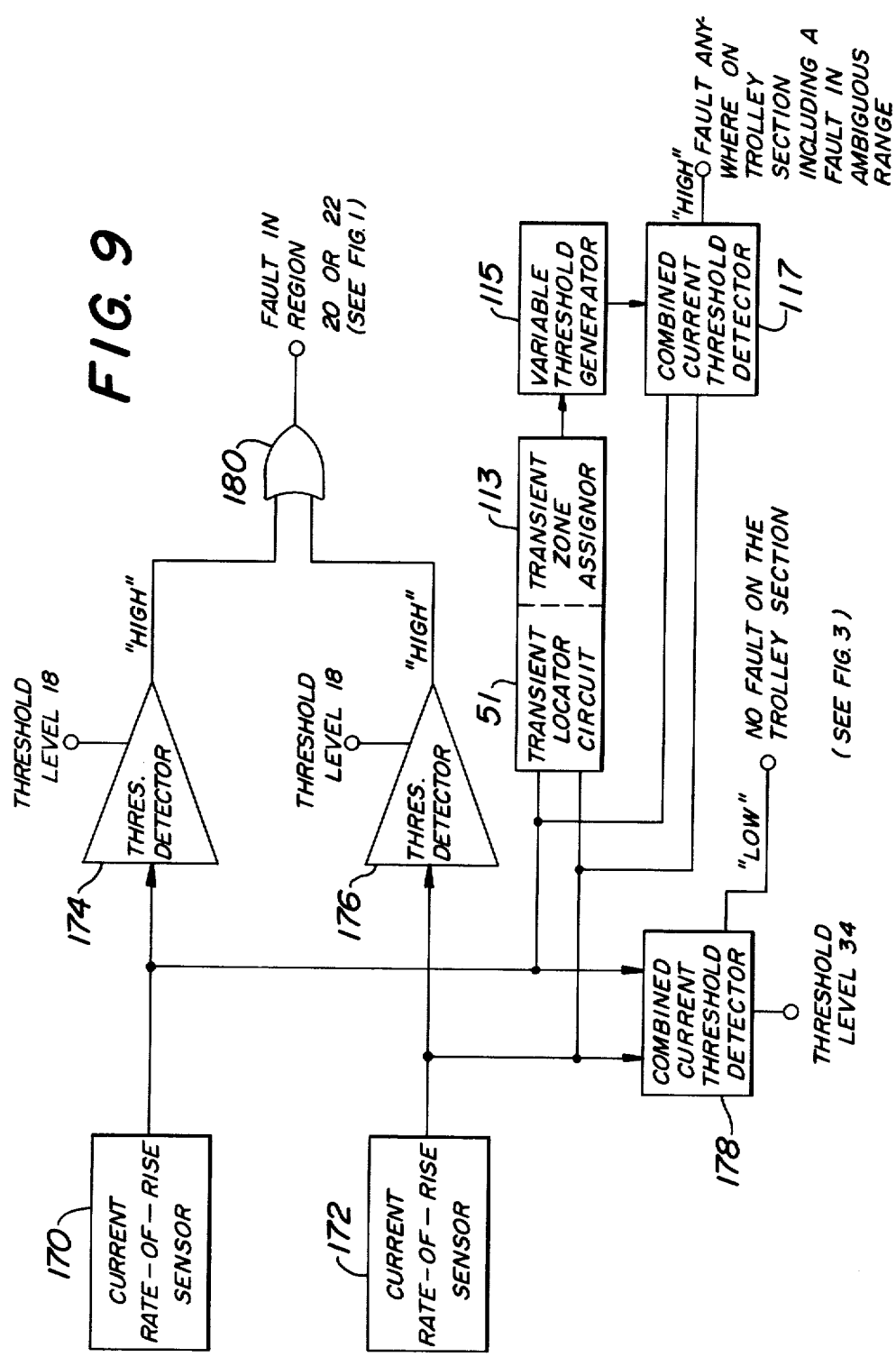

GROUND FAULT SYSTEM AND METHOD OF DETECTION

BACKGROUND OF THE INVENTION

FIELD OF THE INVENTION

This invention relates generally to trolley systems typical of those used in subterranean mines. More specifically, this invention relates to ground fault detection on such trolley systems.

Many mine fires are started by electrical trolley wires because the conventional power circuit breaker overcurrent trip cannot discriminate between the high normal load currents and the smaller resistance ground fault currents. Because conventional circuit breakers must be set at such a level that they will not trip for normal load transients, many ground faults will not be detected. Rate of rise detection schemes which have been successfully applied on 600 volt trolley systems are ineffective on 300 volt trolleys because the inductance of the large 300 volt locomotive motors is less than that of the trolley wires themselves. As a result, a large locomotive, in starting a train near a power substation on a 250–300 volt dc system, can have a rate of rise of current (di/dt) much larger than the rate of rise due to a distance ground fault.

Typically, an underground trolley system includes a plurality of power substations spaced along the trolley line. Any short circuit between the line and ground produces a rapidly rising fault current.

The highest fault currents occur in the vicinity of the power substations. Trolley wires, like transmission lines have distributed reactance (primarily resistance and inductance). Therefore, ground faults and normal loads appearing on the line between two power substations will have greater impact at a particular substation if the fault or load is near that substation. In fact, normal loads at points near a substation can cause a higher current rate of rise at that substation than a ground fault further removed from that substation. The relatively low cable and trolley wire resistance near power substations permits high peak fault circuit currents, and the associated lower inductance enables the short circuit currents to build up much more rapidly than a fault on the section at a point midrange between the two substations. It is therefore important to detect fault conditions quickly at the points near the substations if the high fault currents and the associated high energy into the fault is to be controlled. FIG. 1 shows the current rate of rise as a function of the distance from the substations for resistance faults and for locomotives. As can be seen, the maximum rate of change of current for a large locomotive operating close-in to either of the substations can exceed that of a resistance fault in a locaton midrange between the two substations. It is also apparent from the figure that the rate of rise of a resistance ground fault close-in to a substation can greatly exceed that of even the largest locomotives.

Due to the fact that resistance ground fault currents may be as low as a few hundred amperes on a 300 volt dc trolley section, conventional circuit breakers set at several thousand amperes are not effective in protecting the system against the hazards associated with these ground faults. If the breakers are set at low current level to trip for ground faults, there will be many false alarm shut-downs resulting from high locomotive start-up currents. Although current rate of rise sensors can be useful on 600 v. trolley lines; they are not effective on 300 v. lines because the inductance of the locomotive motors is less than that of the trolley line. Start-up di/dt from close-in locomotives can be much greater than the di/dt for a distant ground fault.

OBJECT OF THE INVENTION

Accordingly, it is an object of the present invention to provide a system for detecting ground faults on subterranean trolley lines.

Another object of the present invention is to provide a ground fault detection system that will determine the location of ground faults.

A further object of the present invention is to provide a ground fault detection system that will distinguish between current rates of change due to ground faults and those due to locomotive start-up, or other normal load transients.

Yet another object of the present invention is to provide a ground fault detection system including an array of sensors distributed throughout the trolley line system.

A still further object of the present invention is to provide a distributed ground fault sensing system capable of distinguishing ground fault transients from normal load transients.

Still another object of the present invention is to provide distributed ground fault sensing on a 300 v. trolley line.

SUMMARY OF THE INVENTION

These and other objects of the present invention are attained by providing a ground fault detection system which treats an entire section of a trolley system as an electrical network. A change in any of the network circuit elements result in a redistribution of all of the currents and voltages in it. Conversely, any change in the distribution of currents and voltages is the result of a specific change in the electrical values of network elements. By utilizing a distributed sensing system to measure currents and changes in currents, network electrical values, including any resistance ground fault locations, are accurately determined. The system described is useful on a trolley system including a plurality of power substations along the trolley power wire. The detection system and method are applied to any pair of adjacent substations or to all such pairs. As such, the system is described for a typical pair of power substations. A first threshold detector circuit is used to detect current rate of rise at each substation which is larger than could possibly be produced by any normal load transient due to locomotive start-up anywhere between those two stations. Current rate of rise signals larger than this threshold detector will have to be the result of a resistance ground fault close in to the power substation. Signals less than this threshold detector may be the result of a more distant resistance ground fault or of a normal load transient on the trolley section. A second threshold detection circuit is used to determine if the sum of the current rate of rise signals from sensors located at both substations is less than the smallest value that could possibly be produced by a ground fault at any location between them.

Current rate of rise signals less than this threshold detector will have to be the result of normal load transients on the trolley section. Signals larger than this threshold detector may be the result of a resistance ground fault on the trolley section or of a normal load transient at a location close in to one of the substations.

Each threshold detector circuit generates a logic level output capable of further processing. If the logic combination of the signals from both threshold detection circuits indicate that a fault condition could possibly exist on the trolley section, a location determining circuit, zone locator, and variable fault detector threshold circuit is used as a positive method for discriminating between the smaller resistance ground fault signals near the midpoint between the pair of substations and the larger normal load transients from locomotive start-up at locations close-in or nearer to the substations.

BRIEF DESCRIPTION OF THE DRAWINGS

A complete understanding of the invention and a fuller appreciation of the many advantages thereof will be derived by reference to the following detailed description when considered in connection with the accompanying drawings, wherein:

FIG. 1 is a graphical representation of current rate of rise for ground faults and for locomotives as a function of distance from a substation.

FIG. 2 is a schematic diagram for a simple threshold detector using an operational amplifier to compare the output of a rate-of-rise sensor with a preset threshold voltage.

FIG. 4 is a schematic diagram for a summing circuit and a threshold detector for the combined outputs of the rate of rise sensors from the two substations.

FIG. 9 is a functional block diagram of the entire ground fault detection system.

DESCRIPTION OF THE PREFERRED EMBODIMENTS

Figure 3:
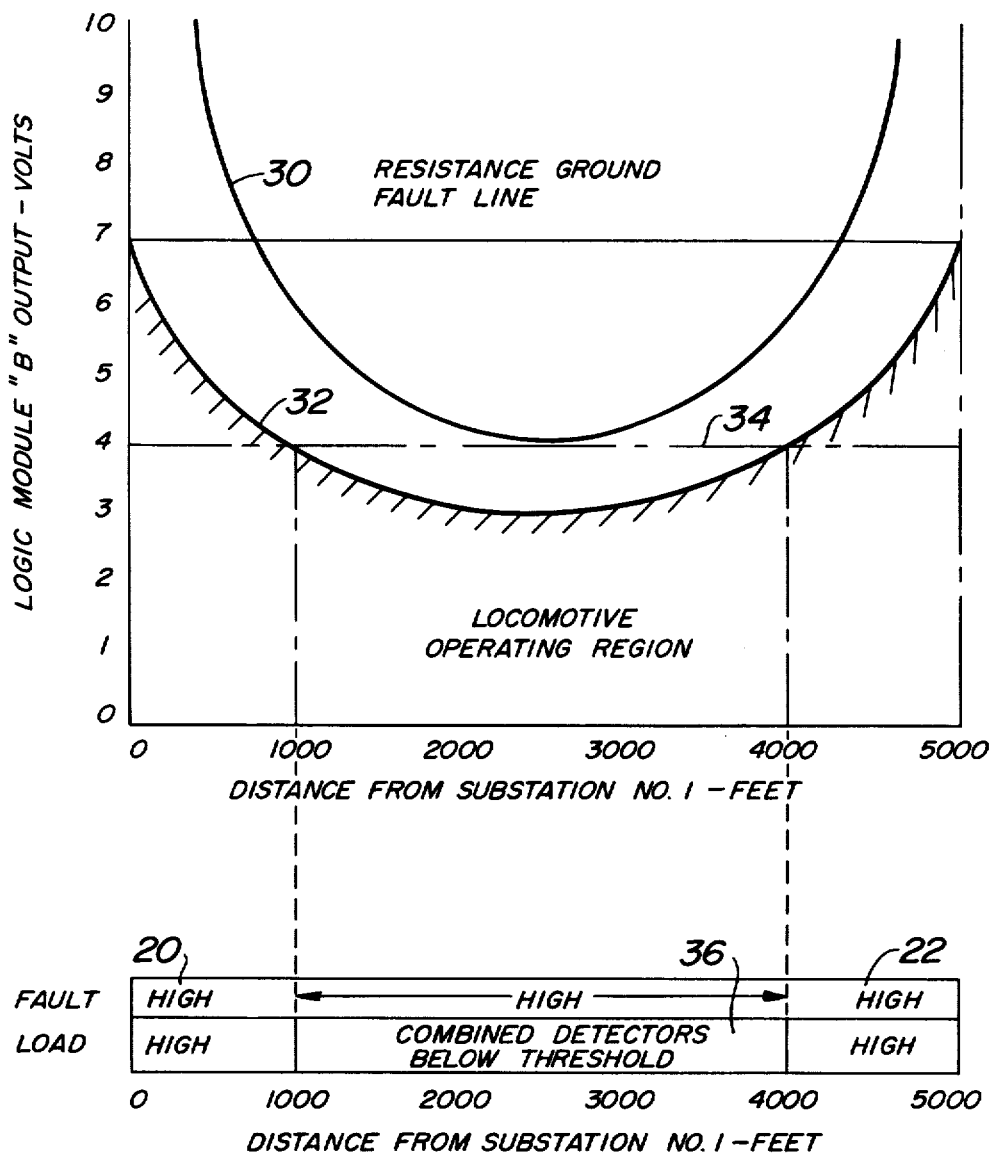
FIG. 3 is a graphical representation of the combined rate of rise of current due to locomotive start-up or ground fault on the trolley system.

Referring now to the drawings wherein like reference characters designate identical or corresponding parts throughout the figures, a ground fault detection system is provided with distributed current rate of rise sensors and centralized logic and control circuits.

The system includes current rate of rise sensors at each power substation, such power substations being spaced somewhat evenly along the trolley line. For the sake of presentation only, it is assumed that such substations are 5,000 feet apart. The ground fault detection scheme can be applied to any pair of adjacent substations and in practice would be applied to every such pair. The following description for one such pair applies to any and all such pairs of adjacent substations.

Referring now to FIG. 1, which is a graphical presentation of current rates of rise caused by ground faults and those caused by locomotive start-up as a function of distance from the first substation. The ordinate of the graph represents current rate of rise (di/dt) as measured by a current rate of rise sensor coupled to the trolley wire at the substation. The first substation is located at the "0" feet distance mark and the second substation is located at "5,000" feet distance mark along the graph abscissa. Current rate of rise (in this embodiment measured in amps/micro second) is measured for load transients and for resistance ground faults at various distances along the graph abscissa.

A length of the trolley line can be viewed in terms of its distributed electrical parameters (resistance, inductance, and capacitance) much the same way as a transmission line can be analyzed. A ground fault occurring between the first and second substation will cause a current rate of rise at the first substation that is inversely proportional to the distance of the fault from the substation. If the fault is quite close to the first substation, the current rate of rise will be extremely high. A ground fault occurring near the second substation will cause the current rate of rise at the first substation to be much lower. A first current rate of rise sensor is located at and coupled to the power line at the first substation. A second current rate of rise sensor is located at and coupled to the power line at the second substation. In this manner, the rate of rise of current at each substation can be measured. Curve 10 represents the current rate of rise at the first sensor for ground faults occurring at all possible locations between the first and second substations. In a similar fashion, the current rate of rise induced at the second sensor (at the 5,000 feet mark) due to a ground fault, can be plotted and is shown as curve 12. A ground fault occurring near the second substation will induce a high rate of current increase in the second sensor and a low rate of current increase in the first sensor. A ground fault occurring near the first substation will induce a low rate of current increase in the second sensor, and a high rate of current increase in the first. These rates of current rise occur as the direct result of distributed inductance along the line between the two substations.

The maximum rate of current rise at both substations attributable to locomotive start-up can be plotted in a similar fashion. The current rate of rise induced at the first substation due to locomotive start-up at locations between the first and second substations is plotted as curve 14, reflecting a higher rate of current rise for locations close to the first substation and a lower rate of rise for locations more distant from the first substation. The maximum current rate of rise at the second substation induced by locomotive start-up between the first and second substations is plotted as curve 16. As would be expected, the current rate of rise is higher at the second substation for locomotive start-up at locations close to that substation and lower for start-up locations more distant from that substation.

Over certain ranges of distance from both substations, the current rates of rise induced by ground faults are always higher than those attributable to locomotive start-up at any location. These ranges of distance are very close to the substations. Using a threshold detector circuit 17 as shown in FIG. 2, and by establishing a threshold level 18 for comparison with the current rate of rise at each sensor, a ground fault occurring near either substation can be easily distinguished from a locomotive start-up condition. The output of a current rate of rise sensor 41 coupled to a power substation, is compared with threshold level 18 by threshold detector 19. The threshold detector circuit of FIG. 2 will indicate a logic level "high" whenever the value of the current rate of rise as monitored by sensor 41 exceeds threshold level 18. If the threshold detector circuit coupled to either substation indicates a "high" output, then threshold 18 has been exceeded and a ground fault must have occurred. It would also be clear that such a fault occurred in a small range of distance (in this case under 1,000 feet) from the sensor indicating a fault condition. It is only within a small range of distance that sufficient rate of rise of the current could occur since the inductance of the short length of trolley wire must be less than that of the motors on the largest locomotive loads expected. If neither threshold detector (first substation or second substation) indicates "high", it is still possible that a fault could have occurred. If a fault occurred outside of the distance range from a substation in which fault current rate of rise always exceeds locomotive start-up rate or rise, it is impossible to distinguish a fault current rate of rise from a locomotive start-up current rate or rise with this circuit. A rate of rise that is below threshold level 18 could correspond to either a distant ground fault or to a locomotive start-up. A chart below the plotted curves of FIG. 1 illustrates the various possibilities. This chart has a distance scale at the bottom corresponding to the distance scale of the plotted curves above it, and is divided vertically into two regions, the upper one corresponding to fault conditions and the lower one corresponding to normal load conditions due to locomotive start-up. Horizontal portions 20 and 22 of the "fault" region indicate distance ranges close to both substations in which it is possible for a threshold detector such as the one shown in FIG. 2 to be triggered when set at threshold level 18. A threshold detector set at level 18, coupled to either substation, being triggered would correspond to a fault condition. In the "fault" region of the chart, the portion between areas 20 and 22 correspond to a distance range over which a ground fault would fail to trigger a threshold detector set at level 18. The lower "load" region of the chart 23 indicates that a rate of rise of current due to locomotive start-up would never trigger threshold detector having a threshold level 18. This is true because threshold level 18 is set to be higher than any rate of change of current due to locomotive start-up.

Thus far, a system has been described including a simple threshold detector coupled to a current rate of rise sensor located at each substation. For convenience, this circuitry is referred to as "Logic Module A". The threshold level 18 is set to be slightly higher than the highest possible rate of rise of current caused by locomotive start-up anywhere between the two substations. There is a small distance range corresponding to that portion of the "fault" region of the chart shown as regions 20 and 22 over which it is possible to discriminate between a resistance ground fault and a normal locomotive load transient. There is a larger distance range corresponding to that portion of the "fault" region of the chart between regions 20 and 22 over which it is necessary to use other means to distinguish between fault and no-fault conditions. The ground fault detection system's capability of distinguishing between load transients due to locomotive start-up from those due to ground faults in this region is better understood with reference to FIG. 3, which is a graphical representation of the combined rate of rise of current in both sensors due to locomotive start-up or ground fault on the trolley system (as measured by the output of a sensor signal summing circuit, identified as "Logic Module B").

As in FIG. 1, the abscissa of the graph of FIG. 3 represents distance from the first substation and the ordinate of the graph is a scale representing current rate of rise (di/dt). However, in this figure, the curves are plotted to represent the summation of current rate of rise at both sensors. In other words, the current rate of rise plotted is simply the rate of current rise indicated at the sensor at the first substation added to the current rate of rise in the sensor at the second substation. In addition, the scale of the ordinate is not calibrated in actual current values, but rather in voltage levels in logic Module "B" at the output of the summing amplifier 46 from combined threshold detection circuit 40 shown in FIG. 4 and discussed below.

Mathematically combining curves 10 and 12 plotted in FIG. 1, a curve 30 is generated. Curve 30 is a plot of the combined rate of current rise in sensors at both first and second substations due to ground faults located at positions between first and second substations. In a similar fashion, curves 14 and 16 plotted in FIG. 1 are added, resulting in curve 32. Curve 32 is a plot of the combined maximum rate of current rise in sensors at both first and second substations due to locomotive start-up at locations between the first and second substations.

A second threshold level 34 is established at a level slightly lower than the minimum vlaue of combined current rate of rise in both sensors due to a ground fault. It will be seen from the curves of FIG. 3 that establishing such a threshold allows the user to establish a wide range of distances over which it is possible to distinguish between locomotive start-up currents and ground fault currents. In this particular case, if the threshold level 34 is not exceeded by the combined rate of current rise, then it can be determined that there is no ground fault at any point on the trolley section between the two substations. If, on the other hand, threshold level 34 is exceeded by the combined rate of current rise, it cannot be determined with certainty whether the transient is caused by either a resistance ground fault (somewhere on curve 30, exceeding threshold 34) or a locomotive start-up (somewhere on curve 32 exceeding threshold 34). These results are depicted clearly in the chart at the bottom of FIG. 3, divided into an upper "fault" region and a lower "load" region corresponding to locomotive start-up. The lower "load" region is divided into three portions, the center portion 36 corresponding to the distance range of 1,000–4,000 feet from the first substation. In this region, it is impossible for the locomotive maximum load transient to produce a combined current rate of rise in both sensors which will exceed the threshold level 34, established by the plotted curves in FIG. 3. The upper "fault" region shows graphically that a resistance ground fault can produce a combined current rate of rise in both sensors which will exceed the threshold level 34 at any distance between the two substations.

To implement this logic "B" function, a more elaborate threshold detector must be utilized. FIG. 4 is a schematic diagram for such a threshold detector circuit which mathematically adds the outputs of the sensors at the first and second substations and then compares a threshold level 34 to the resulting combination.

Referring now to FIG. 4, the combined current threshold detector circuit, shown generally as 40, includes current rate of rise sensors 42 and 44 at the first and second substations respectively. There is no reason that sensor 42 or 44 cannot be the same sensor as sensor 41 of FIG. 2. They are shown as separate sensors only to promote clarity of the descriptions. The signals from sensors 42 and 44 are mathematically summed by amplifier 46 and its associated input and feedback resistive network including two input resistors 45 and 47 and feedback resistor 49. The gain of amplifier 46 is determined by the ratio of these resistors. The output of amplifier 46 is coupled to the inverting input of threshold detector 48. Threshold level 34 is applied to the non-inverting input of threshold detector 48. The output of threshold detector 48 is a logic "high" if threshold level 34 is exceeded by the magnitude of signal applied to the inverting input of threshold detector 48 and hence combined threshold detector circuit 40. The output of threshold detector 48 is a logic "low" if threshold level 34 is not exceeded by the magnitude of the signal applied to the inverting input of threshold detector 48.

The combined current threshold detector circuit 40 shown in FIG. 4 compares the combined (summation) rate of rise of current from sensors 42 and 44, located at both first and second substations, with a threshold level 34 which is less than the minimum magnitude of combined current rate of rise for a ground fault occurring between these substations. By properly establishing threshold level 34, it is possible to distinguish between a definite "no-fault" condition and a "possible fault" condition over the entire distance range between the two substations.

Note the portions 20 and 22 of the "fault" region of the chart in FIG. 1, representing information gleaned from a comparison of the individual current rates of rise from the sensors located at the first and second substations with threshold level 18 established from the curves plotted in FIG. 1. An exceeded threshold from these comparisons indicates the presence of a fault condition in those distance ranges corresponding to those portions of the "fault" region.

By logically combining the outputs of the detection circuits of FIGS. 2 and 4, there is provided a means for positively identifying both the close-in fault conditions (near substations) causing a high rate of rise, and also those conditions which are clearly not a fault, because the rate of rise of the combined current is less than the minimum value for a ground fault at the midrange position between the two substations. The uncertainty exists when the combined current rate of rise exceeds the threshold level 34 for the circuits shown in FIG. 4, but the individual sensor outputs do not exceed the threshold level 18 for the circuit shown in FIG. 2.

The most difficult discrimination task involves the condition below detector threshold 18 plotted in FIG. 1 and above detector threshold 34 plotted in FIG. 3. Under these conditions, the logic output of the threshold circuit schematically depicted in FIG. 2 is a logic "low" and the output of the combined current threshold detector circuit 40 schematically depicted in FIG. 4 is a logic "high". Referring again to FIG. 3, one can imagine a curved or variable threshold line that can be located between resistance ground fault curve 30 and maximum locomotive operating curve 32. In order to utilize a variable threshold level in a threshold detection circuit, it is necessary to establish a logical and measurable basis for the threshold level under various conditions. Such a variable threshold level can be established if the distance of a suspected fault from a substation such as the first substation is known. This distance information is obtained from the ratio of the magnitude of the rate of rise of currents indicated by sensors at each of the substations.

Figure 5:
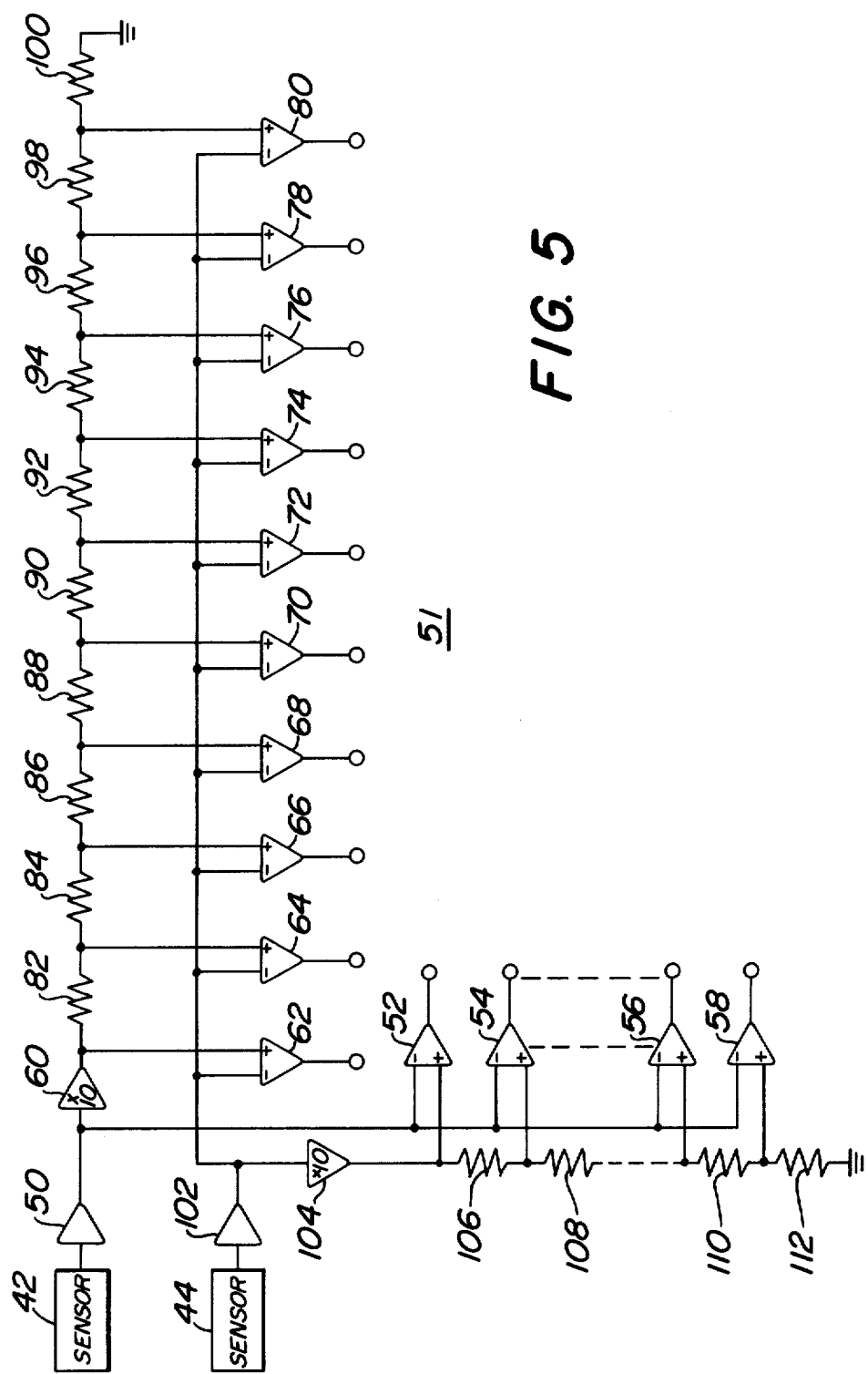
FIG. 5 is the schematic diagram of the transient location circuit.
Figure 6:
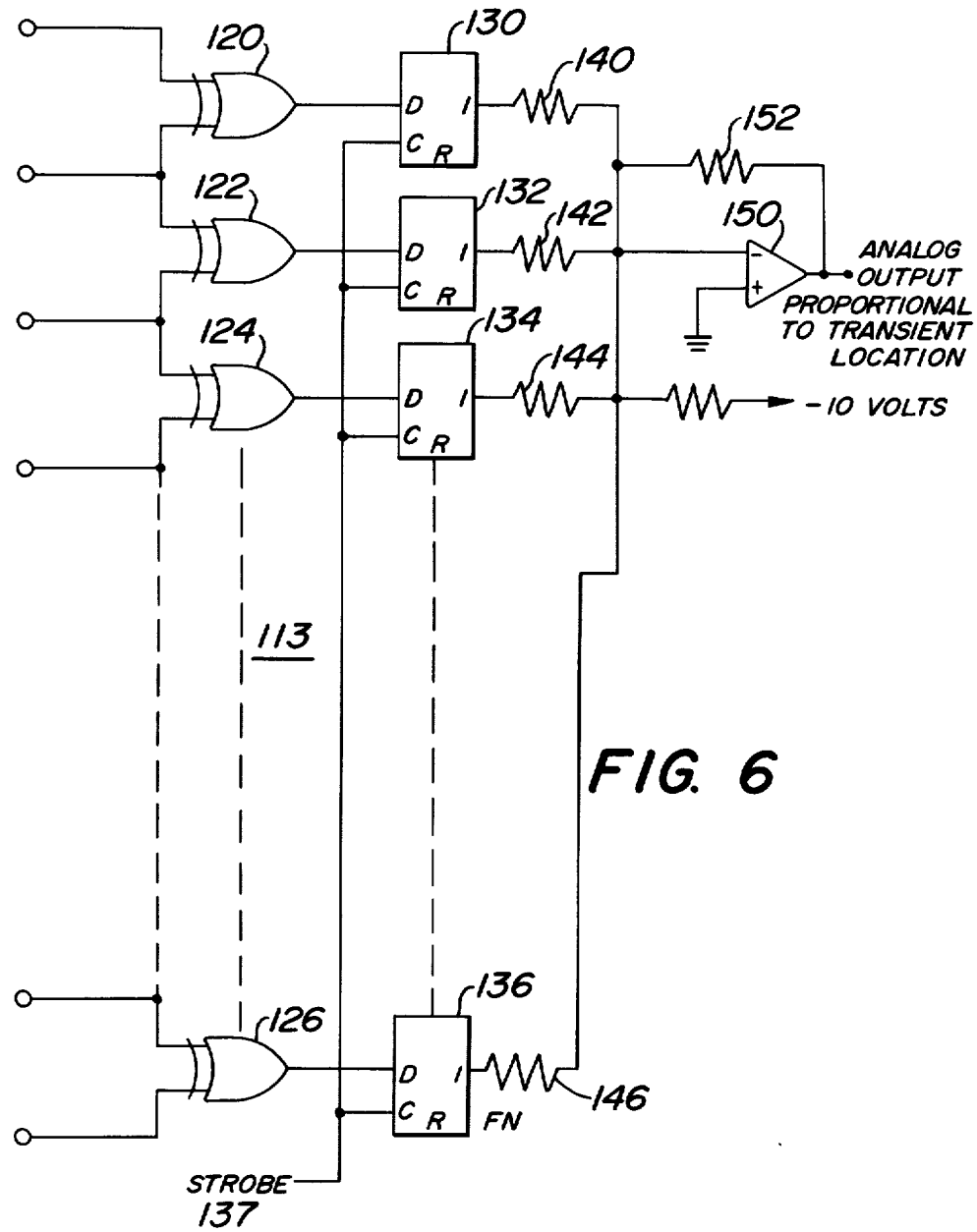
FIG. 6 is the schematic diagram of the transient location zone assigner circuit.

FIG. 5 schematically depicts a transient locator circuit 51. Similarly, FIG. 5 may be termed as a computing analog to digital circuit. Current rate of rise sensor 42 is located at and coupled to the first substation and current rate of rise sensor 44 is located at and coupled to the second substation. A plurality of operational amplifiers and comparators are used to produce logic level signals indicating the location of load or fault transients. If the transient location is midway between the two substations the outputs of sensors 42 and 44 will be equal and if the transient were located closer to one sensor than another, the current rate of rise between sensors 42 and 44, when compared, would show an imbalance. Referring to FIG. 5, the output of sensor 42 at the first substation is coupled to the input of a buffer amplifier 50 having unity gain. The output of amplifier 50 is coupled to the inverting input of a series of threshold detectors 52 to 58. In addition, the output of amplifier 50 is coupled to the input of an amplifier 60 having gain 10. The output of amplifier 60 is in turn coupled through a resistive ladder to the non-inverting inputs of a plurality of comparators 62 to 80. Specifically, the output of amplifier 60 is coupled directly to the non-inverting input of comparator 62, through resistor 82 to the non-inverting input of comparator 64, through resistor 82 and a second resistor 84 to the non-inverting input of comparator 66 and so on. In other words, a series arrangement of resistors 82 to 100 is coupled from the output of amplifier 60 to ground. Between each pair of resistors is a tap off to the non-inverting input of a comparator 62 to 80. In this manner, each succeeding comparator 62 to 80 receives a smaller portion of the signal from amplifier 60 corresponding to the rate of rise of current sensed by current sensor 42. In a similar fashion, sensor 44 is coupled to a buffer amplifier 102. In turn, the output of amplifier 102 is coupled directly to the inverting input of each of comparators 62 to 80. In addition, the output of amplifier 102 is coupled to an amplifier 104 having gain equal to 10. The output of amplifier 104 is coupled through a series of resistors 106 to 112 to ground. Between each pair of resistors, a tap off couples to the non-inverting input of comparators 52 to 58. Each of comparators 52 to 58 and 62 to 80 will produce either a logic level "high" or a logic level "low" based upon the comparison of signals at its inverting and non-inverting inputs. The interpretation of comparators indicating logic level "high" and those indicating logic level "low" will indicate the relative position of a load transient between sensors 42 and 44, i.e. between substations. The number of "high" outputs from comparators 52 to 58 and 62 to 80 is related to the position of a transient between the two substations. Values for resistors 82 to 100 and 106 to 112 are a function of the magnitudes of current rate of rise as plotted in FIG. 3. Comparator outputs 62 to 80 and 52 to 58 are utilized by a transient zone assinger circuit 113 to determine the specific zone in which a transient is being initiated. Referring now to FIG. 6, which is the schematic diagram of a transient zone assigner circuit, a plurality of exclusive OR gates 120 to 126 and a plurality of storage flip-flops 130 to 136 produce a discrete output for each of a plurality of location zones along the length of trolley section between the first and second substations. Specifically, the output of comparator 58 is coupled to one input of an exclusive OR gate 120. The output of comparator 56 is coupled to the second input of exclusive OR gate 120 and to the first input of exclusive OR gate 122. The remaining exclusive OR gates are coupled in similar fashion to the other comparators such that each gate is coupled to two adjacent comparators. Based upon the values in resistive ladder 106 to 112 and 82 to 100, the output of each exclusive OR gate 120 to 126 will correspond to a fixed distance range between the first and second substations. For example, the output of exclusive OR gate 120 may correspond to a range of 4,500 feet to 5,000 feet from the first substation 1. The output of exclusive OR gate 122 could then correspond to a range of 4,000 feet to 4,500 feet from substation 1, etc. Each of the outputs of exclusive OR gates 120 to 126 is coupled to the data input of a flip-flop 130 to 136. The clock input of flip-flop 130 to 136 is coupled to a strobe signal 137. The outputs of flip-flops 130 to 136 are coupled through a resistive ladder 140 to 146 including resistor 140 coupled to the output of flip-flop 130, resistor 142 coupled to the output of flip-flop 132, and resistor 144 coupled to the output of flip-flop 134, etc. These resistors are in turn coupled to the inverting input of a digital to analog converter circuit 150 utilizing a feedback resistor 152. Digital to analog converter circuit 150 produces a variable output voltage as a function of the location of a transient along the trolley section. This output voltage can in turn be used to establish a variable threshold level to discriminate between faults and normal load transients over the entire length of the trolley section, including the ambiguous range above 34 shown on the chart of FIG. 3 and below 18 shown on FIG. 1.

Figure 7:
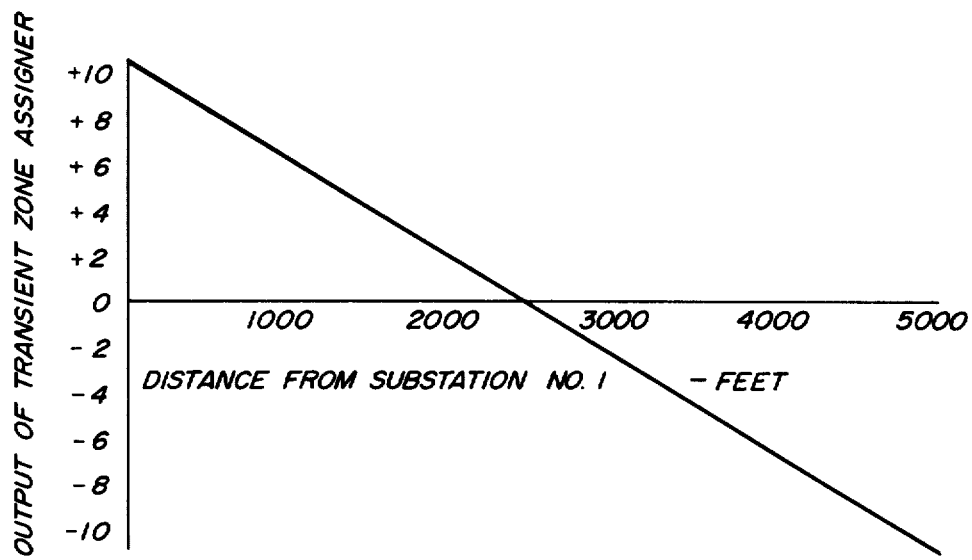
FIG. 7 is a graphical representation of the output of the transient zone assigner circuit as a function of distance between substations.

Utilizing the fault zone locator circuit as shown in FIG. 6, an analog output voltage related to the location of the transient is generated and can be plotted as shown on FIG. 7. FIG. 6 may alternatively be termed a computing digital to analog circuit.

Figure 8:
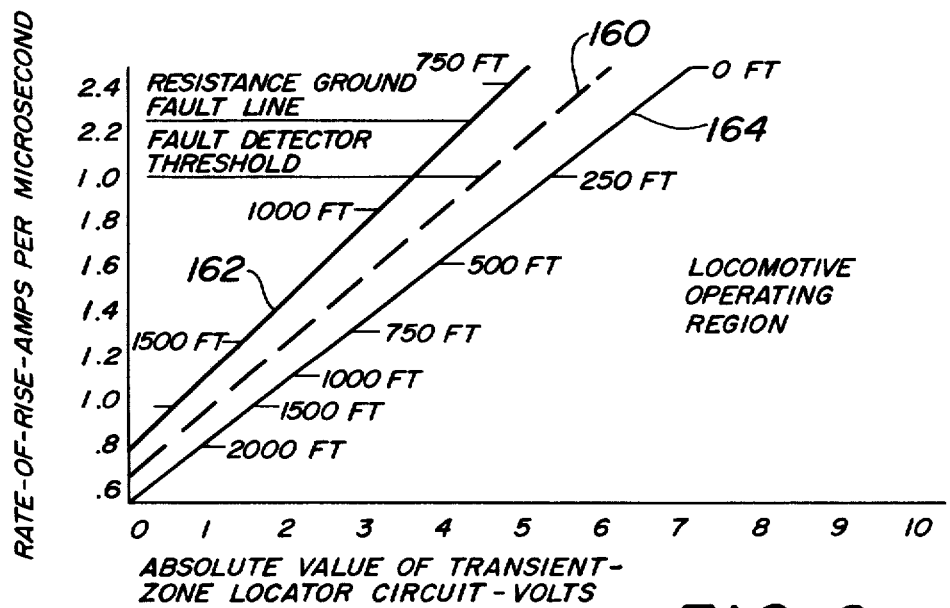
FIG. 8 is a graphical representation of the use of a variable threshold level to distinguish between ground faults and normal load transients in the ambiguous range between a definite "fault" condition and a definite "no-fault" condition.

Referring now to FIG. 8 there is graphically represented a variable fault detector threshold curve 160 located between a ground fault curve 162 and a maximum locomotive operating curve 164. In accordance with the absolute value of the output voltage derived from the fault zone locator circuit, schematically detailed in FIG. 6, a variable threshold 160 can be applied to additional threshold detector circuitry (not shown) so that the threshold level 160 will always be able to distinguish between a ground fault as plotted in curve 162 and a maximum transient due to locomotive start-up as plotted in curve 164. In this manner, ambiguities remaining after the use of threshold detector level 18 applied to the individual current rate of rise sensor 41, and threshold detector level 34 as applied to the combined outputs of sensors 42 and 44 are resolved.

The method for detecting ground faults between two power substations and distinguishing said ground faults from the maximum normal transients due to locomotive start-up is better understood with reference to FIG. 9, which is a functional block diagram of the entire system.

Current rate of rise sensors 170 and 172 (like sensors 41, 42 and 44 shown in FIGS. 2 and 4) are coupled to the trolley wire at the first and second substations and generate signals proportional to the rate of current rise at the substation where they are coupled. The output of sensors 170 and 172 are coupled respectively to threshold detectors 174 and 176 (like threshold detector 19 shown in FIG. 2) where they are compared with threshold level 18 established slightly higher than the highest rate of rise of current possible at either substation due to locomotive start-up. The output of detectors 174 and 176 are logically combined by an OR gate 180 to produce an output signal indicating whether threshold level 18 has been exceeded. An output from gate 180 indicates that a fault has occurred in region 20 or 22 of FIG. 1.

The outputs of sensors 170 and 172 are also combined and compared with a second threshold level 34 using a combined current threshold detector 178 (like combined current threshold detector circuit 40 of FIG. 4). Level 34 is established to be slightly less than the combined rate of rise at both substations due to the presence of a ground fault anywhere between the two substations. A "low" output of detector 178 indicates that there is no ground fault, at any location on the trolley section. A "high" output of detector 178, however, may be the result of a resistance ground fault at any location on the trolley section, or it may be caused by a normal load transient outside of region 36 of FIG. 3. The outputs of gate 180 or detector 178 resolve the presence or absence of a ground fault over a substantial distance range between the substations, but leave an ambiguous range wherein the rate of current rise may be caused by either a resistance ground fault or a normal load transient.

Transient locator circuit 51 coupled to sensors 170 and 172 and transient zone assigner 113 coupled to locator circuit 51 produce a signal related to the location of a transient between the substations. The absolute value of this signal is used by a variable threshold level to be utilized by a combined current threshold detector 117. Detector 117 compares the combined rate of rise of currents from sensors at both substations with a threshold level designed to be greater than the maximum rate of current rise for locomotives, but less than the rate of current rise for ground faults at the location specified by transient locator 51 and zone assigner 113. In this manner, transients at any location on the trolley section, including those in the ambiguous range (outside of ranges 20, 22 and 36) are resolved as either due to locomotive start-up or due to a ground fault condition.

Therefore, it is apparent that there has been provided a ground fault detection system useful in distinguishing between ground faults and normal current transients due to locomotives start-up on a 300 v. DC trolley system.

A logic circuit is used to detect a current rate of rise at either substation which is larger than could possibly be produced by any normal load transient on the trolley section. A second logic circuit is then used to determine if the sum of the current rate of rise signals from the two substations is less than the smallest value that could possibly be produced by a resistance ground fault at any location on the trolley section. If the combination of the two logic signals indicate that a fault condition could exist on the trolley section, a location determining circuit and a variable fault detector threshold voltage is used as a positive method for discriminating between the smaller resistance ground fault signals near the center of the trolley section and the larger normal load transients from large locomotives at locations near the substations. This circuit will also distinguish between a normal locomotive load transient and a resistance ground fault over the entire length of the trolley section, providing a back-up or redundant circuit to the previously described logic circuitry.

Obviously, other embodiments and modifications of the present invention will readily come to those of ordinary skill in the art having the benefit of the teachings presented in the foregoing description and drawings. It is therefore to be understood that this invention is not to be limited thereto and that said modifications and embodiments are intended to be included within the scope of the appended claims.

What is claimed is:

1. A ground fault detection system for detecting and distinguishing ground faults from normal loads on a line between at least two power substations, comprising:
   (a) first current rate of rise sensor means coupled to a first of said power substations;
   (b) second current rate of rise sensor means coupled to a second of power substations;
   (c) first threshold detection means coupled to at least one of said current rate of rise sensor means for indicating a ground fault condition within a first predetermined distance range on said line close in to one of said power substations; and,
   (d) second threshold detection means coupled to said current rate of rise sensors for indicating an absence of a ground fault condition at any location or distance range between said first and second power substations.

2. The ground fault detection system as recited in claim 1 where said first threshold detection means indicates said ground fault condition when said one of said current rate of rise sensors passes a first signal exceeding a first predetermined value.

3. The ground fault detection system as recited in claim 1 where said second threshold detection means indicates said absence of said ground fault condition when a combined rate of rise of current from said first and second sensors pass a second signal less than a second predetermined value.

4. The ground fault detection system as recited in claim 3 including amplifier means having an input coupled to said first and second current rate of rise sensors and an output coupled to said second threshold detector means.

5. The ground fault detection system as recited in claim 1 including means for determining a location of a current transient inducing load between said first and second power substations, said location determining means being coupled to said first and second current rate of rise sensor means.

6. The ground fault detection system as recited in claim 5 where said location determining means includes:
   (a) a first plurality of comparator members having inverting and non-inverting inputs where said inverting inputs are coupled to said first current rate of rise sensor; and,
   (b) a second series resistive ladder coupling said first current rate of rise sensor to a ground condition and having a tap-off connection to each of said first plurality of comparator members.

7. The ground fault detection system as recited in claim 6 where said location determining means includes:
   (a) a first sensor resistive ladder coupling said second rate of rise sensor means to a ground condition and having a tap-off connection between each of said resistors in said ladder, one to each of said non-inverting inputs of said first plurality of comparator members; and,
   (b) a second plurality of comparator members having inverting and non-inverting inputs where said inverting inputs are coupled to said second current rate of rise sensor means and said non-inverting inputs are coupled to said second series resistive ladder tap-offs, said location of said transient inducing load being indicated by relative outputs of said first and second plurality of comparator members.

8. The ground fault detection system as recited in claim 5 including:
   (a) means for generating a variable threshold level related to said location of said current transient; and,
   (b) means for comparing said variable threshold level to said combined sensed rate of rise of current and generating a predetermined signal when said threshold level is exceeded.

9. The ground fault detection system as recited in claim 5 where said location determining means further includes means for converting collective outputs of said first and second plurality of comparator members into a unitary analog signal proportional to said load location.

10. A method for ground fault detection for a trolley system including at least one locomotive and at least two power substations and for distinguishing between ground fault current and currents due to locomotive start-up, comprising the steps of:
    (a) measuring a current rate of rise at said first substation and generating a first signal proportional thereto;
    (b) measuring a current rate of rise at said second substation and generating a second signal proportional thereto; and,
    (c) comparing each of said generated first and second signals proportional to said rate of current rise with a preselected threshold level corresponding to the maximum current rate of rise at either substation attributable to a locomotive start-up condition.

11. The method for ground fault detection as recited in claim 10, further including the steps of:
    (a) generating a first fault signal whenever either of said generated signals exceeds said preselected threshold level;
    (b) summing said signals proportional to the current rate of rise at said first substation with said signal proportional to the current rate of rise at said second substation to produce a combined current signal;
    (c) comparing said combined current signal with a second preselected threshold level corresponding to the minimum current rate of rise at either substation attributable to a ground fault; and,
    (d) generating a no-fault signal whenever said combined current signal fails to exceed said second preselected threshold level.

12. The method for ground fault detection as recited in claim 11, further including the steps of:
    generating a location signal proportional to the location between said two substations of all current rate of rise signals whenever said first threshold level is not exceeded and whenever said second threshold level is exceeded;
    producing a third threshold level signal proportional to an absolute value of said location signal; and,
    comparing said combined current signal with said third threshold level signal and generating a second fault signal whenever said third threshold level is exceeded.

13. A ground fault detection system for a trolley line including at least two power substations, comprising:

a first current rate of rise sensor coupled to said first power substation;

a second current rate or rise sensor coupled to said second power substation;

a first threshold detector coupled to said first current of rise sensor for determining the presence of a ground fault in a first predetermined distance range;

a second threshold detector coupled to said second current rate of rise sensor for determining the presence of a ground fault in a second predetermined distance range;

a combined current threshold detector coupled to said first and second current rate of rise sensors for determining an absence of a ground fault between said first and second power substation;

a transient locator and zone assignor for determining the location of a transient producing load between said first and second substations;

a variable threshold generator coupled to said transient locator for generating a threshold level which is a function of said transient producing load location; and, a second combined current threshold detector for comparing said combined current signals with said threshold level generated by said variable threshold generator, whereby the presence or absence of a ground fault is determined.

* * * * *